United States Patent [19]

Lazarus et al.

[11] Patent Number: 5,126,230
[45] Date of Patent: * Jun. 30, 1992

[54] HIGH CONTRAST, POSITIVE PHOTORESIST DEVELOPER CONTAINING ALKANOLAMINE

[75] Inventors: Richard M. Lazarus, Mission Viejo; Kenneth L. Bell, Irvine; Carla M. Bauer, LaVerne, all of Calif.

[73] Assignee: Morton International, Inc., Chicago, Ill.

[*] Notice: The portion of the term of this patent subsequent to Feb. 28, 2006 has been disclaimed.

[21] Appl. No.: 587,320

[22] Filed: Sep. 21, 1990

Related U.S. Application Data

[60] Division of Ser. No. 564,665, Aug. 7, 1990, which is a continuation of Ser. No. 303,506, Jan. 27, 1989, abandoned, which is a continuation-in-part of Ser. No. 160,639, Mar. 10, 1988, abandoned, which is a continuation-in-part of Ser. No. 35,413, Apr. 6, 1987, Pat. No. 4,808,513.

[51] Int. Cl.$^5$ .......................... G03C 5/24; G03C 5/34
[52] U.S. Cl. .................................... 430/309; 430/325; 430/331; 252/156; 252/541; 252/544; 252/547
[58] Field of Search ....................... 430/309, 331, 325; 252/547, 544, 541, 156

[56] References Cited

U.S. PATENT DOCUMENTS

| | | | |
|---|---|---|---|
| 3,984,243 | 10/1976 | Shimimura et al. | 430/268 |
| 4,294,911 | 10/1981 | Guild | 430/331 |
| 4,379,830 | 4/1983 | Deutsch et al. | 430/331 |
| 4,411,981 | 10/1983 | Minezaki | 430/299 |
| 4,464,461 | 8/1984 | Guild | 430/326 |
| 4,530,895 | 7/1985 | Simon et al. | 430/145 |
| 4,729,941 | 3/1988 | Itoh et al. | 430/331 |
| 4,808,513 | 2/1989 | Lazarus et al. | 430/331 |

FOREIGN PATENT DOCUMENTS

| | | |
|---|---|---|
| 56-57035 | 5/1981 | Japan . |
| 57-42710 | 3/1982 | Japan . |
| 58-82243 | 5/1983 | Japan . |
| 60-263147 | 12/1985 | Japan . |
| 61-39041 | 2/1986 | Japan . |
| 396664 | 8/1973 | U.S.S.R. . |
| 439035 | 8/1974 | U.S.S.R. . |

OTHER PUBLICATIONS

Grigorovich et al., "Interaction of Photosensitive Materials, etc." translated from Zhurnal Prikladnoi Khimii, vol. 48, No. 6 pp. 1307-1311, Jun. 1975.
Patent Abstracts of Japan, vol. 6, No. 209 (P-150) (1087), Oct. 21st 1982: JP-A-57 114 141 (Sanei Kagaku Kogyo K.K.) Jun. 15, 1982.
European Search Report #EP 88 30 2542 of Dec. 20, 1988.

Primary Examiner—Charles L. Bowers, Jr.
Assistant Examiner—Patrick A. Doody
Attorney, Agent, or Firm—Gerald K. White

[57] ABSTRACT

Compositions and methods for developing quinone diazide positive-working photoresists. The compositions consist essentially of an aqueous solution of a tetraalkylammonium hydroxide and an adjunct having a structure selected from:

Structure I: $R^2-N(R^2)-CH(R^1)-CH(R^1)-[CH(R^1)]_n-OH$ and

Structure II: $(R^1)_m-N\begin{matrix}CH(R^1)-CH(R^1)\\ CH(R^1)-CH(R^1)\end{matrix}O$ wherein n is 0 or 1; m is 1 or 2; and each $R^1$ and $R^2$ is independently selected from hydrogen, methyl, or ethyl, but in Structure I the two $R^2$'s are not both ethyl. The methods involve use of this composition to develop the indicated photoresists. The addition of an adjunct of the indicated type prevents the formation of irregular deposits on the edges of unexposed portions of the photoresist lines when the photoresist is developed. Selection of these adjuncts also increases the uniformity of line widths of photoresist lines developed according to the present invention, and increases the process latitude of the developer.

28 Claims, 3 Drawing Sheets

FIG.6

# HIGH CONTRAST, POSITIVE PHOTORESIST DEVELOPER CONTAINING ALKANOLAMINE

This is a divisional of co-pending application Ser. No. 07/564,665 filed on Aug. 7, 1990 pending, which is a continuation of U.S. application Ser. No. 07/303,506 filed on Jan. 27, 1989, abandoned, which is in turn a continuation-in-part of Ser. No. 07/160,639 filed on Mar. 10, 1988, both abandoned, which is in turn a continuation-in-part of Ser. No. 07/035,413 filed on Apr. 6, 1987, now U.S. Pat. No. 4,808,513.

TECHNICAL FIELD

This invention relates to compositions and processes for developing quinone diazide positive-working photoresists, particularly high contrast resists used in the fabrication of integrated circuits on single-crystal wafers.

BACKGROUND ART

Quinone diazide positive-working photoresists, and similar positive-working compounds used in the preparation of lithographic printing plates, are described in U.S. Pat. No. 4,464,461, issued to Guild on Aug. 7, 1984, particularly from column 3, line 39 to column 7, line 16. The foregoing patent is hereby incorporated herein by reference. Commercial photoresists of this kind include OFPR-800; other photoresists sold by the Dynachem division of Morton International, Inc., Tustin, Calif.; and products sold by Shipley Company, Inc., Newton, Mass.; Eastman Kodak Company, Rochester, N.Y.; and others.

A positive-working photoresist functions by being coated on a suitable substrate, image-wise exposed to actinic radiation, then subjected to a development process which removes those portions of the photoresist which were previously exposed to radiation, leaving the unexposed portions of the resist intact. The developed photoresist pattern protects the corresponding portions of the substrate, from a further operation performed on the substrate, such as ion implantation, etching, plating, or the like. (In the case of printing plates, the residual portions of the photoresist have a different affinity for ink than the exposed portions of the substrate.) The known developers for quinone diazide positive-working photoresists comprise an aqueous solution of an alkali. The concentration of alkali is chosen to provide a developer which will selectively attack the exposed portion of the photoresist under the exposure and development conditions which have been selected.

While some commercially available developers contain metal salts such as sodium carbonate, sodium hydroxide, and others as alkaline agents, the art has recently chosen to avoid metal ion containing alkaline materials, or other metal ion sources, in photoresist developers. A concern has developed that residual metal ions left by the developer might form conductive paths in the finished device. Because of this avoidance of metal ion containing developers, the preferred alkaline materials are tetraalkylammonium hydroxides, and particularly tetramethylammonium hydroxide (TMAH). TMAH based developers are discussed in U.S. Pat. Nos. 4,423,138, issued to Guild on Dec. 27, 1983; 4,464,461, issued to Guild on Aug. 7, 1984; European Patent Application 0,062,733, filed by Cawston et al on Jan. 28, 1982 and published on Oct. 20, 1982, based on a corresponding U.S. patent application filed Apr. 10, 1981; Grieco et al, "Photoresist Developer Compounds", *IBM Technical Disclosure Bulletin*, Volume 13, Number 7 (December, 1970); "Improved Resist Developer," *Research Disclosure* 22713, March, 1983, pages 98–99; and others.

Several prior patents show the possibility of using morpholine or an alkanolamine, particularly ethanolamine, in photoresist developers. According to its English language abstract, Japanese patent application 59-119105, believed to have been published Dec. 26, 1985, teaches the use of either an inorganic alkali or an organic amine such as monoethanolamine or ethylenediamine as an alkaline agent in a photoresist developer. U.S. Pat. No. 4,464,461, column 1, lines 40-43, indicates that developers containing, for example, alkanolamines are "well known". U.S. Pat. No. 4,530,895, issued to Simon et al on Jul. 23, 1985, at column 1, lines 59-62, suggests use of a developer containing an alkaline substance such as diethylamine, ethanolamine, or triethanolamine as a photoresist developer. U.S. Pat. No. 4,411,981, issued to Minezaki on Oct. 25, 1983, discloses from column 3, line 46 to column 4, line 8, the use of a developing and etching solution for a photoresist containing various organic bases such as TMAH, monoethanolamine, diethanolamine, or triethanolamine, among many other basic reacting compounds. The Minezaki patent also discloses a photoresist developer in column 5, lines 10–16, and Table 3 comprising an aqueous solution of 5% TMAH, 1-2% morpholine, 0.04% coumarin, about 0.1% of an unspecified surfactant, and the balance water. Minezaki states this composition is diluted double or triple with distilled water to provide a developing and etching solution. The ratio of TMAH to morpholine is from 1:0.4 to 1:0.2 in this composition. None of these references suggests any reason to mix a quaternary ammonium compound and an alkanolamine or morpholine to correct any shortcoming of either material used alone as a developer.

As will be shown in comparative examples, TMAH used alone as a photoresist developer causes what appears to be a deposit of flaky residue along the upper and lower edges of lines of developer photoresists, particularly high contrast photoresists. The presence of this residue in exposed areas (which are intended to be free of photo-resist) suggests potential problems.

Alkanolamines by themselves are not suitable as developers for high contrast photoresists of the type exemplified herein, as they develop lines with poor resolution, fail to develop them altogether, or strip the photoresist. High concentrations of these developers also roughen the upper, normally smooth surfaces of developed photoresist lines.

One continuing challenge, as circuit geometries shrink and quality standards are maintained or raised, is how to maximize line width uniformity. Good line width uniformity means that lines of developed photoresist have nearly the same nominal line width and other dimensions as the mask lines and that these dimensions don't vary significantly depending on the location of the line on the wafer, the location of the wafer in a boat in which a batch of wafers are immersion processed together, or the order in which wafers are spray processed.

Another continuing challenge in photoresist developer research is how to achieve the desired line width uniformity despite variations from the nominal conditions selected for development. A developer composi- tion which achieves this is said to have wide process latitude.

It is further desirable that a photoresist developer not cause the side walls of the developed photoresist to become less vertical (sloped).

SUMMARY OF THE INVENTION

One object of this invention is to solve the residue problem of TMAH or similar photoresist developers while retaining or improving the line width uniformity and wide process latitude of such developers. A further object is to accomplish the preceding object with a developer which is usable in commercial automated equipment, especially spray equipment which demands that a developer be easily sprayable.

A first aspect of the invention is a composition for developing an exposed, quinone diazide, positive-working photoresist. The composition consists essentially of an aqueous solution of an alkali which also contains an adjunct. The alkali is a tetraalkylammonium hydroxide, and is present in the composition in an amount sufficient to enable the composition to develop the photoresist. The adjunct has a structure selected from:

In the above structures, n is 0 or 1; m is 1 or 2; and each $R^1$ and each $R^2$ is independently selected from hydrogen, methyl, or ethyl (except that in Structure I both $R^2$ moieties cannot be ethyl). If m is 2 (representing the presence of a quaternary nitrogen atom), each $R^1$ attached to the nitrogen atom is selected independently.

This adjunct is present in the composition in an amount sufficient to reduce formation of the previously mentioned irregular deposits on the edges of unexposed portions of the photoresist during development of the photoresist. The amount of the alkali and the adjunct to be used can be variously expressed to accomplish different objectives. For one example, the adjunct can be present in an amount sufficient to increase the $C_p$ value of the composition, as defined later in this specification. For another example, the adjunct can be present in an amount sufficient to increase the process latitude of the composition, as defined later in this specification.

In a preferred aspect of the invention, about 0.7 to about 1.6% by weight of the tetraalkylammonium hydroxide is present, and the ratio of the hydroxide to the adjunct is less than or equal to about 1:3 by weight. The composition can optionally contain from about 0 to 0.05% by weight of a surfactant to improve the sprayability of the composition and to avoid the problem of dewetting the resist during development.

A second aspect of the invention is a method for developing an exposed quinone diazide positive-working photoresist without forming irregular deposits on the edges of unexposed portions of the photoresist. The method comprises the steps of providing an exposed photoresist for development; providing the developer previously defined above; developing the photoresist with the indicated developer until the pattern is cleared; and rinsing the developer from the photoresist.

Still another aspect of the invention is a similar method in which enough of the previously stated adjunct is present in a developer to provide a $C_p$ value of at least about 1.33 for the developer as used to develop a quinone diazide positive-working photoresist.

BRIEF DESCRIPTION OF DRAWINGS

FIGS. 1 through 6 show lines developed according to Examples 36 through 41, respectively. FIG. 6 represents the state of the art prior to the present invention, and FIG. 5 shows development using an adjunct not within the present invention.

DETAILED DESCRIPTION OF PREFERRED EMBODIMENTS

Photoresist developers according to the present invention consist essentially of a solvent, an alkali, an adjunct as defined above, and optionally a surfactant and various other minor ingredients.

While various organic solvents are used in some photoresist developers, for the present purpose the preferred solvent is deionized water. The amount of water used is dictated by the amounts of other ingredients. While the amount of water is not generally critical, the compositions described herein contain from about 60% to about 94% by weight water.

The alkali is the primary ingredient which dissolves exposed portions of the photoresist when the photoresist is developed. Various tetraalkylammonium hydroxides have been used or suggested as suitable alkaline compounds; the use of any of these well known compounds is contemplated in the broadest aspect of the present invention. (As used herein in the context of tetraalkylammonium hydroxides, "alkyl" does not include alkanol moieties.) The most common alkali is tetramethylammonium hydroxide (TMAH).

The amount of alkali useful herein is most broadly more than 0.5% by weight, preferably from about 0.7 to about 2% by weight, more preferably from about 0.8 to about 1.6% by weight, and most preferably from about 0.9 to about 1.1% by weight. The amount of alkali used in a particular formulation must be adjusted to account for the influence of the other ingredients, particularly the adjuncts, which are also alkaline.

The adjuncts useful herein are those specified previously in the Summary. Table I recites all the adjuncts within the previously stated Structure I wherein each $R^2$ is hydrogen. Adjuncts within Structure I in which one or both $R^2$ moieties are methyl or ethyl, preferably methyl (but excluding a structure in which both $R^2$'s are ethyl), are also contemplated herein. Adjuncts within structure I are also called alkanolamines herein. Adjuncts within Structure II contemplated herein include morpholine.

As the comparative examples provided below will illustrate, several compounds structurally related to the adjuncts specified above either interfere with the development process or do not provide the benefits of the present invention. Thus, diols such as propylene glycol; diamines such as ethylenediamine; and di- or trialkanolamines have been found not to be useful herein.

The preferred adjuncts are species 1, 2, and 10 as stated in Table I and dimethyl-3-amine-1-propanol (DMAP). These adjuncts are all suitable for photoresist development by immersion. Most preferred is species 10, which has also been found to be suitable for spray development of photoresists.

The proportion of adjunct contemplated herein is determined largely by the ratio of the alkali to the adjunct by weight. (A lower ratio indicates less TMAH in relation to the amount of the adjunct.) For spray development this ratio is no more than 1:9, preferably 1:12 to 1:38, and most preferably about 1:15 if the adjunct is 1-hydroxy-3-amino-propane. For immersion development the ratio can be as great as 1:3. The lower limits are provided in the preferred range of ratios because when the indicated maximum proportion of adjunct is exceeded, the surfaces of developed lines will be roughened. The upper limits of the ranges of ratios are specified to provide a noticeable reduction in the amount of residue formed. The most preferred ratios have been found to minimize the residue problem at minimal cost while avoiding the roughening effect of excess adjunct. These ratios will be found to vary with the proportion and selection of alkali, the choice of a particular adjunct, and the choice of immersion or spray development.

The desired amount of adjunct will typically be from about 4% to about 40% by weight of the composition. A preferred range is from about 14% to about 21% by weight.

The present compositions may optionally contain a surfactant, in particular a nonionic surfactant, to improve the sprayability and wetting properties of the formulation. In some spray development equipment, some of the present compositions will emerge from the spray nozzle as a cohesive stream of fluid, rather than as finely atomized droplets. The result can be that the developer is not adequately distributed during the spray step. The addition of certain adjuncts, particularly in large amounts, has been found to reduce the sprayability of the compositions. This effect is believed to result from changes in the viscosity or the surface tension of the compositions.

Another fault which some of the present developers have is a tendency to dewet, or withdraw from, the photoresist pattern during development. This reduces the amount of time the photoresist pattern is exposed to the developer, and thus inhibits development. The presence of a nonionic surfactant alleviates this problem too.

The preferred nonionic surfactants are the polyethylene oxide condensates of alkyl phenols. These compounds include the condensation products of alkyl phenols having an alkyl group containing from about 6 to 12 carbon atoms, in either a straight chain or branched chain configuration, with ethylene oxide in amounts equal to 5 to 25 moles of ethylene oxide per mole of alkyl phenol. The alkyl substituent in such compounds can be derived, for example, from polymerized propylene, diisobutylene, octene, or nonene. Examples of compounds of this type include nonylphenol condensed with about 9.5 moles of ethylene oxide per mole of nonylphenol, dodecyl phenol condensed with about 12 moles of ethylene oxide per mole of phenol, dinonyl phenol condensed with about 15 moles of ethylene oxide per mole of phenol, and diisooctylphenol condensed with about 15 moles of ethylene oxide per mole of phenol. One particular surfactant which has proven useful herein is TRITON X-100, marketed by Rohm and Haas Co., Philadelphia, Pa. The useful amount of surfactant is limited by the tendency of such surfactants to degrade the optimal vertical wall structure of the developed lines of photoresist, causing sloping. The preferred composition, therefore, contains no more than about 0.05% by weight of a nonionic surfactant. Some compositions require no surfactant at all.

Other components, such as preservatives for TMAH, dyes, wetting agents, cosolvents, buffers, and the like may be added to developers according to the present invention. The preferred additives are essentially free of metal cations.

For purposes of the present specification, the amount of alkali effective to develop the photoresist is determined experimentally by providing a proposed composition and varying the amount of alkali to find a concentration which will develop the photoresist without stripping it. The necessary amount of alkali will be determined by many factors, including the presence of an adjunct and any other alkaline constituents of the developer; exposure energy; line geometries; development mode and conditions; and temperature. The examples in this specification provide specific compositions which have been found to perform well. One of ordinary skill in the art can readily formulate a developer having an appropriate amount of alkali to develop a particular photoresist.

Similarly, the amount of the adjunct which is sufficient to reduce formation of irregular deposits on the edges of unexposed portions of the photoresist during development will depend on the developer formulation, process conditions, the photoresist used and how it is applied, and other factors. An amount of adjunct sufficient to reduce formation of irregular deposits is determined qualitatively by examining scanning electron microscope photomicrographs of photoresists developed with various developers to select the optimal developer for a given task. When the amount of the adjunct is expressed as an amount sufficient to increase the $C_p$ value of the composition, $C_p$ values of the composition under the desired development conditions are measured. The amount of adjunct is adjusted to maximize the $C_p$ value under the desired development conditions of at least about 1.33 when one micron lines are developed.

If the amount of adjunct is expressed as an amount sufficient to increase the process latitude of the composition, process latitude values of the composition are measured. The amount of adjunct is adjusted to maximize the process latitude in a particular formulation. Preferred compositions provide a process latitude of at least about 1.33 under the development conditions specified in the Examples.

It is not evident from any prior art known to the inventors that selection of the present developer compositions will allow a photoresist to be developed under high contrast conditions without forming irregular deposits on the edges of unexposed portions of the photoresist, providing a $C_p$ value and a process latitude for the developer of at least about 1.33.

Various modes of development are contemplated within the scope of the present invention. In immersion development, the coated and exposed wafers, either alone or in a boat of wafers, are supported in a bath of the selected developer for a sufficient time to develop the photoresists. In spray process development individual wafers coated with the photoresist are transported to a development site and developed by one or more operations such as streaming the developer onto the surface of the photoresist; spinning the wafer to remove excess material, particularly fluid, from its surface; spraying the developer over a wide surface of the wafer; and puddling, which is done by allowing residual developer to remain as a meniscus or puddle covering the surface of the stationary wafer. Automated spray development equipment can be programmed to provide the desired selection and sequence of development steps to develop each wafer.

EXAMPLES

The following examples are provided to illustrate practice of the present invention, including the best mode. The claims, and not the examples, define the scope of the present invention.

Photoresist samples were prepared as follows. The substrate was a silicon wafer with a polyoxide surface coating, pre-treated with hexamethyldisilane to promote adhesion. EPR-5000, a novolak resin-based composition sold by the Dynachem division of Morton International, Inc., Tustin, Calif., was coated onto the substrate using conventional automated spin-coating equipment. The coating thickness was about 13,000 Angstroms (1.3 microns), plus or minus about 300 Angstroms, and was measured for each wafer individually. The coatings were dried and conditioned in the usual manner, providing sensitized substrates typical of those used in the industry.

For all experiments, the sensitized substrates were exposed through an exposure mask on a step-and-repeat exposure tool with ultraviolet radiation provided by a high pressure mercury vapor lamp. The size of the exposed image (24 millimeters by 14 millimeters) allowed several exposures (18 or less) to be distributed on the surface of the substrate without overlapping. It was possible either to incrementally increase exposure energies at each exposure or to repeat one exposure energy several times across the surface of the substrate.

Developer solutions were prepared by mixing the ingredients recited below to provide one-gallon batches.

In the immersion testing, an entire batch of each developer solution was poured into a large dish, forming a bath deep enough to completely immerse a wafer being developed. The exposed substrates were developed by manually immersing each one in the dish of developer. The immersion time was one minute (60 seconds). Then, the substrates were removed from the dish of developer and rinsed by placing them in a cascade tank fed from the bottom with deionized water.

For spray/puddle development testing the development and rinsing steps were performed using conventional automated spray development equipment sold by Silicon Valley Group, San Jose, Calif. In each program several steps were completed sequentially. For each step, the wafer was rotated at the indicated rate while the indicated material was applied in the indicated manner for the indicated amount of time, according to one of the schedules in Table II.

Film speed of the developer was evaluated by observing through an optical microscope at 400× magnification which of several developed one micron lines of resist, representing different doses of radiation, were resolved.

Linewidth uniformity (Critical Dimension Uniformity) is evaluated using several exposures at the same dose across the surface of the substrate. Linewidth measurements are made at each of these exposures, the measurements are averaged, and the standard deviation is calculated. A value called "$C_p$" can be calculated from this data according to the following formula:

$$C_p = \frac{\text{delta } L}{6 \text{ sigma}}$$

Delta L is the difference between the minimum and maximum acceptable linewidths of a line defined in the photoresist by a 1 micron line on the exposure mask. Sigma is one standard deviation.

For a 1 micron nominal linewidth, the acceptable range of linewidths is defined to be from 0.9 to 1.1 microns; delta L is thus (1.1–0.9) microns, or 0.2 microns. An acceptable value of sigma is defined herein to be less than or equal to 0.025 microns. Presenting the same information in terms of the $C_p$, an acceptable value for $C_p$ is defined herein to be less than or equal to 1.33 microns.

Process latitude is a measure of a developer's ability to function satisfactorily despite defined variations in process parameters. For present purposes process latitude is satisfactory if, at exposure energies of from 250 to 150 mJ/cm$^2$; a resist thickness of 1.3 microns (plus or minus 0.1 microns) of EPR-5000 resist; a (resist) soft bake temperature of from 110° C. to 120° C.; a developer temperature of 19° C. (plus or minus 1° C.); and an exposure tool focus on the top of the resist (plus or minus 1.0 microns); $C_p$ exceeds 1.33 microns. Process latitude can be reported quantitatively as the minimum value of $C_p$ over the defined range of exposure energies. The developers according to the present invention have better process latitude than conventional resists which do not contain adjuncts.

In Examples 1–4, monoethanolamine, abbreviated "MEA", was used as an adjunct according to the present invention. The proportions of ingredients and other information are set out in Table III. In the Tables, development mode "I" indicates immersion development. "Spray 1" indicates spray development according to Program 1 set forth in Table II. The abbreviation "mJ/cm$^2$" indicates the radiation exposure in millijoules per square centimeter. "Result" provides a qualitative indication of the result of the experiment. LR indicates low resolution or a lack of resolution, meaning that the developer did not selectively remove the exposed portions of the photoresist while refraining from attacking the unexposed portions thereof. "Poor spray" means that the composition was not properly atomized by the spray nozzle. "Poor develop" means that exposed portions of the photoresist were not removed or were removed inadequately. The "ratio" is a recapitulation of the ratio of TMAH to the adjunct, here MEA, providing a ready comparison of the development result with the ratio of these ingredients.

Looking at Table III, it will be evident that examples 1 and 2 provide good development in an immersion mode, while in Example 3 the spray pattern provided during spray development was considered poor, indicating that the material was developed but that irregular development is potentially present. Example 4, in which only 0.5% TMAH and 80.0% MEA is employed as a developer, demonstrates that this is too little TMAH to provide proper development, even in the presence of 80% monoethanolamine. Example 4 also establishes that monoethanolamine by itself, even at high concentrations, is not a suitable developer for the present photoresist.

Table IV, in which the adjunct is 1-amino-2-hydroxypropane (species 2 of Table I, identified in Table IV as 1,2-MPA), shows the results of Examples 5-8. In this Table and subsequent Tables, "X-100" indicates TRITON X-100 nonionic surfactant, identified previously in the specification. "Spray 2" in the development mode line indicates Spray Develop Program 2 in Table II. In the result column "res." indicates that a residue was present on the edges of developed liens of the photoresist.

1-amino-2-hydroxypropane sometimes provides a residue (Examples 5 and 8) and sometimes does not (Examples 6 and 7). It is better for immersion development than for spray development; a poor spray pattern was noted during spray development. The best result is obtained at a ratio of 1:18 as in Example 7, in which no residue was noted on the developed lines.

Examples 9-19 in Tables V and VI show development with 1-amino-3-hydroxypropane, abbreviated in Tables V and VI as 1,3-MPA. This is species 10 of Table I. Looking first at Table V, Examples 9 and 10 are essentially identical spray development runs, but in Example 9 a residue was noted at a ratio of 1:12, while in Example 10 no residue was noted. This indicates that this is a marginally acceptable formulation for spray development. Similarly, Examples 11 and 12 are essentially identical spray development runs. In one case a residue was provided, and in the other case no residue was observed. Examples 9-12 were all run at a ratio of 1:12, which therefore is less preferred for spray development than the 1:15 ratio of Example 13. A 1:15 ratio has been found in this and other examples of spray development to almost never leave residue on the edges of the developed resist lines. Thus, a ratio of 1:15 is preferred to provide optimal spray development with minimal amounts of the alkanolamine.

Examples 14-19 show ratios of TMAH to 1,3-MPA of 1 to 3 or lower successfully used according to the present invention. Examples 14-16, using spray development, illustrate that the 1:15 composition of 1,3-MPA can be sprayed successfully and provides residue free development. The compositions of Examples 14-16 all contain TRITON X-100 surfactant, in increasing amounts. In Example 16 0.05% of this surfactant was too much, as it caused developed resist line sidewalls to slope or otherwise deviate from the optimal vertical sidewalls. Thus, 0.05% of this surfactant is more than the preferred maximum amount under the other conditions of this example.

Examples 17, 18, and 19 illustrate the operability of ratios as high as 1:3 and as low as 1:37.9 for immersion development. Example 19 illustrates that at extremely low ratios, even when the amount of TMAH is minimized, the developed resist has a rough surface. Roughness is believed to be caused by the presence of a large amount of the adjunct. While some roughness can be tolerated, it is not desirable, so a minimum ratio of about 1 to 38 is preferred herein.

Tables VII, VIII, and IX embody the results of comparative Examples 20-35, using various similar compounds in place of the adjuncts of the present invention.

In Table VII, Examples 20-24, the alkanolamine was replaced with ethylene diamine (abbreviated EDA in the table) in ratios of from a maximum of 1:3 to a minimum of 1:37.8. In all cases immersion development was used. The relatively large proportion of TMAH in the high ratio of Example 20 stripped both developed and undeveloped portions of the resist from the substrate. The remaining examples all show the formation of residue or heavy residue, and the lowest ratio of TMAH (and highest ratio of EDA) provides a heavy residue and lack of resolution which do not constitute suitable development. The inventors conclude from this example that a wide range of different proportions and ratios of ethylene diamine does not exhibit the beneficial properties of the present invention.

Table VIII provides comparative examples 25-29 in which the adjunct is replaced with ethylene glycol (EG). Over a wide range of ratios and proportions of ethylene glycol, the result is again a residue on the developed lines of photoresist, in either the immersion or the spray mode of development. Example 29 is prior art, and illustrates that a formulation containing just TMAH in a proportion sufficient to develop the photoresist provides a residue, and thus is not an optimal developer according to the present invention. As noted previously, Example 4 shows the contrary situation in which a large amount of an alkanolamine according to the present invention is present (80%) and an insufficient proportion of TMAH is present. Comparing these examples, it is evident that neither TMAH alone nor an alkanolamine alone provides proper development, but the other examples show that the combination of these two ingredients improves development unexpectedly.

In Table IX, Examples 30 and 31 show the use of diethanolamine (abbreviated: DEA); comparative Examples 32 and 33 show the use of triethanolamine (abbreviated: TEA); and comparative examples 34 and 35 employ diethylethanolamine (abbreviated: DEEA) in place of the present adjuncts. In all these comparative examples, each in two different proportions employing the immersion development mode, development was hindered by the additive. In Examples 30-33, despite a high maximum exposure, only a latent image was produced. This means that the exposed portions of the photoresist were not removed by this formulation. In Examples 34 and 35 the developed and undeveloped portions of the photoresist were both stripped.

The comparative examples illustrate that the class of additives which prevent residue formation without disturbing the function of the resist developer is narrow. Ethylene diamine differs from the adjunct monoethanolamine by substitution of a second amine for a hydroxy group. Ethylene glycol of comparative Examples 25-29 is different from monoethanolamine only in that a second hydroxyl group is substituted for the amine group. In short, a structure with an amine group on one end and hydroxyl group on the other works, but respective structures with two amine groups or two hydroxyl groups in the same positions do not work. The additives of comparative examples 30-35 differ from the present adjuncts, and specifically from monoethanolamine, because two ethyl or ethanol moieties are substituted for the amine hydrogen atoms of the present generic formula. Diethanolamine has two ethanol moieties instead of the single ethanol moiety of monoethanolamine according to the present invention. Triethanolamine has three ethanol moieties in place of the single ethanol moiety of the present invention. Diethylethanolamine has two ethyl groups in place of the amine hydrogens of monoethanolamine. These substitutions provide compounds which do not function in the advantageous manner of the present adjuncts.

The formulations and data for Examples 36-41 are reported in Table X. Exemplary two micron lines of each developed resist were photographed with a scanning electron microscope at a magnification of 20,000 diameters and an energy of 23 KV. FIGS. 1 through 6 respectively correspond to Examples 36 through 41.

Figure 1:
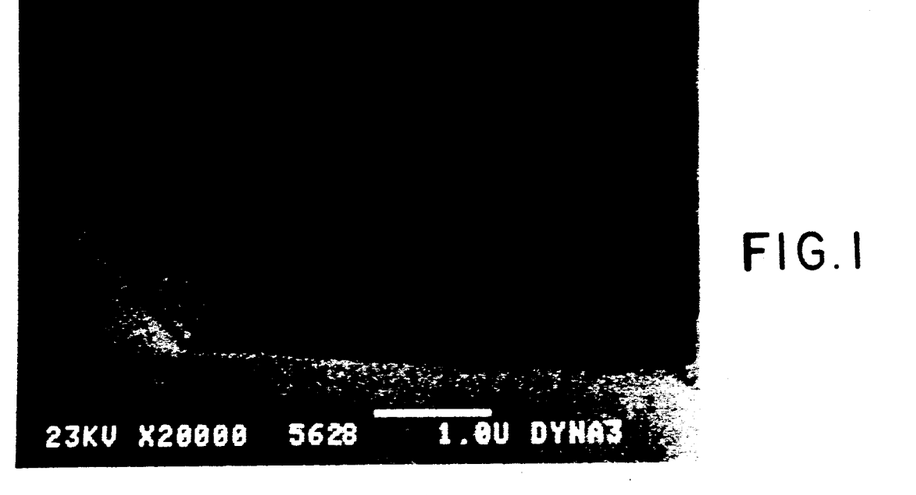
FIGS. 1 through 6 are each a perspective fragmentary photographic view of a developed two micron (nominal mask dimension) photoresist line, also illustrating the surrounding substrate and a portion of the adjacent line. Each photograph was taken at a magnification of 20,000 diameters, at an energy of 23 KV, using a scanning electron microscope.

In FIG. 1 and Example 36, the developer contained 1-amino-2-hydroxypropane at a ratio of 1:12. FIG. 1 illustrates some residue, particularly along the upper edges of the resist, but no roughness. (The slight roughness or grain shown in the photographs on the top surface of each resist line and on the substrate between the resist lines is a combination of noise in the microscope and photographic grain.) FIG. 1 shows a reduction of the residue problem, but not a complete solution.

Figure 2:
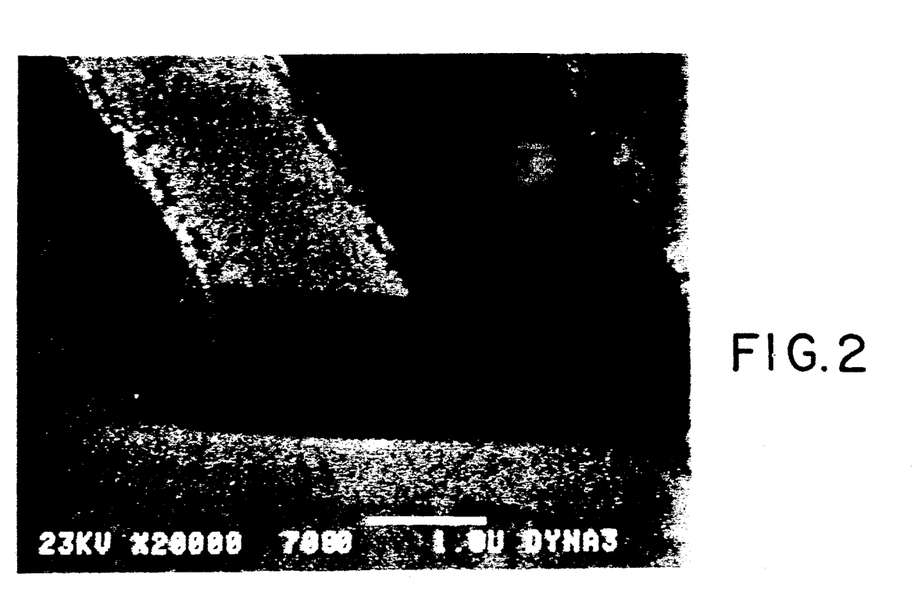

In FIG. 2 and Example 37, the formulation contained the adjunct 1-amino-3-hydroxypropane at a ratio of 1:12. The result shown in FIG. 2 is similar to that shown in FIG. 1.

Figure 3:
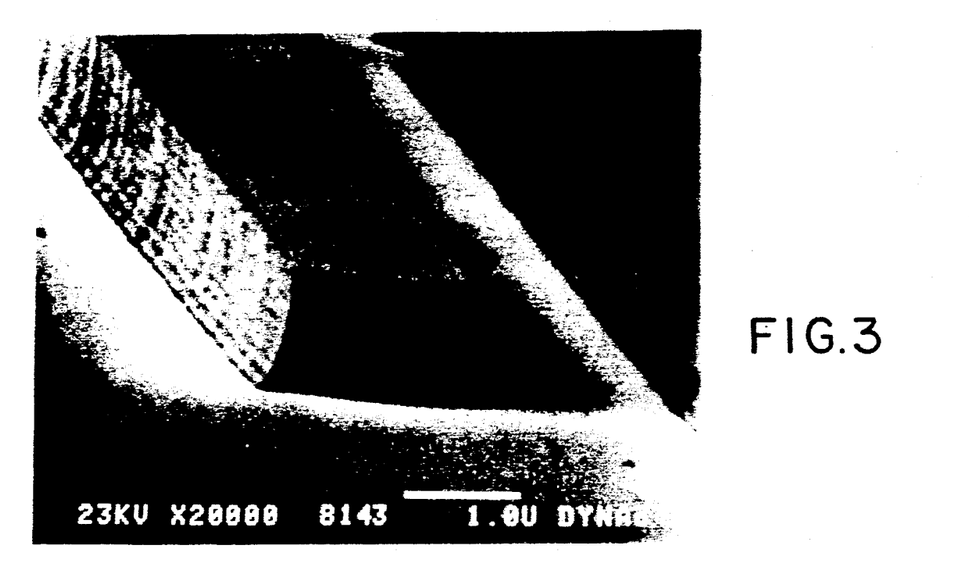

In FIG. 3 and Example 38, a 1:15 ratio of 1-amino-3-hydroxypropane was used; the formulation contained 1.00% of TMAH. As FIG. 3 shows, the developed lines have smooth upper surfaces and no visible residue. (The regular, horizontal striations on the sidewalls of the lines are artifacts of standing waves in the exposure radiation, and are not residue.)

Figure 4:
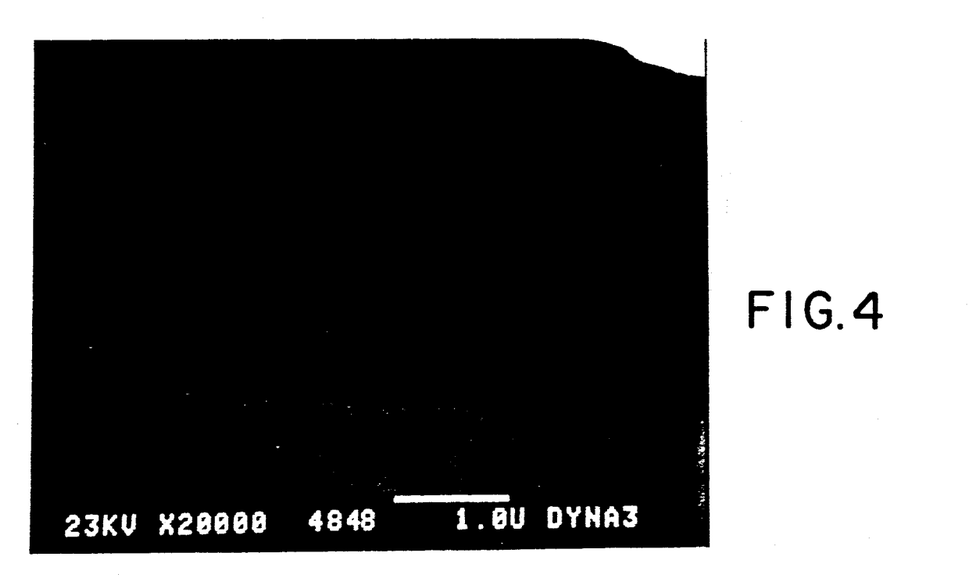

In Example 39 and FIG. 4, the ratio of TMAH to 1-amino-3-hydroxypropane is 1:37.9. The line is clearly developed and has no residue, but the entire top and side surfaces of the line are roughened; this is considered less than optimal development, although the advantages of the present invention other than absence of roughness are obtained in this example.

Figure 5:
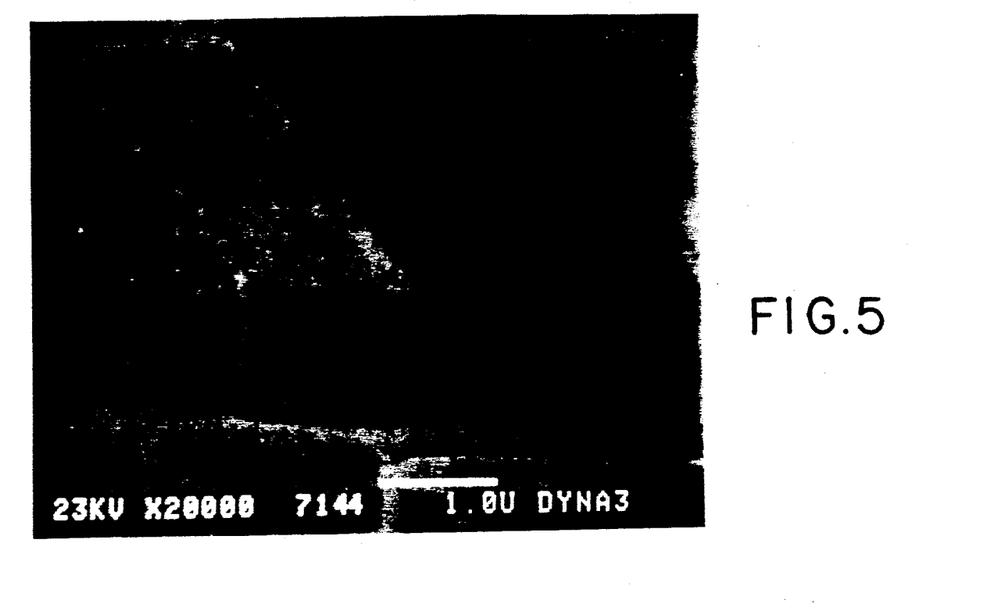

In Example 40 and FIG. 5, ethylene diamine is added to the developer at a ratio of 1:20. Heavy residue is present on the edges of the top surface. The vertically oriented ridge-and-valley irregularity of the sidewalls is also related to the presence of the residue problem.

Figure 6:
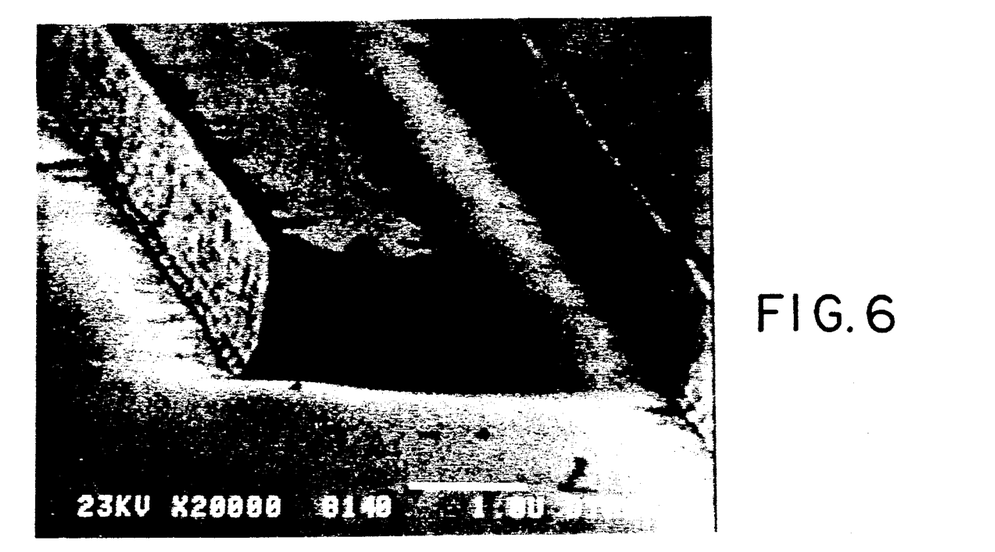

Example 41 and FIG. 6 illustrate developement with a prior art formulation of 2.0% by weight TMAH and no other additives. FIG. 6 thus illustrates that without an adjunct a heavy residue is observed.

In Table XI, adjuncts other than the alkanolamines of Table I were used according to the present invention. In Example 42, a developer containing morpholine was used successfully. No residue was noted, although the developed lines had a roughened surface. DMAP (dimethyl-3-amino-1-propanol) was successfully used in Example 43, and neither residue nor roughened surfaces were observed.

TABLE I

| Alkanolamine Adjunct Species | |
|---|---|
| Species # | Name |
| 1 | 1-amino-2-hydroxyethane |
| 2 | 1-amine-2-hydroxypropane |
| 3 | 1-amino-2-hydroxybutane |
| 4 | 1-hydroxy-2-aminopropane |
| 5 | 2-amino-3-hydroxybutane |
| 6 | 2-amino-3-hydroxypentane |
| 7 | 1-hydroxy-2-aminobutane |
| 8 | 2-hydroxy-3-aminopentane |
| 9 | 3-amino-4-hydroxyhexane |
| 10 | 1-amino-3-hydroxypropane |
| 11 | 1-amino-3-hydroxybutane |
| 12 | 1-amino-3-hydroxypentane |

TABLE I-continued

| Alkanolamine Adjunct Species | |
|---|---|
| Species # | Name |
| 13 | 1-amino-2-methyl-3-hydroxypropane |
| 14 | 1-amino-2-methyl-3-hydroxybutane |
| 15 | 1-amino-2-methyl-3-hydroxypentane |
| 16 | 1-amino-2-ethyl-3-hydroxypropane |
| 17 | 2-hydroxy-3-aminomethylpentane |
| 18 | 3-aminomethyl-4-hydroxyhexane |
| 19 | 1-hydroxy-3-aminobutane |
| 20 | 2-amino-4-hydroxypentane |
| 21 | 2-amino-4-hydroxyhexane |
| 22 | 2-amino-3-hydroxymethylbutane |
| 23 | 2-amino-3-methyl-4-hydroxypentane |
| 24 | 2-amino-3-methyl-4-hydroxyhexane |
| 25 | 2-amino-3-hydroxymethylpentane |
| 26 | 2-amino-3-(1-hydroxyethyl)-pentane |
| 27 | 3-hydroxy-4-(1-aminoethyl)-hexane |
| 28 | 1-hydroxy-3-aminopentane |
| 29 | 2-hydroxy-4-aminohexane |
| 30 | 3-amino-5-hydroxyheptane |
| 31 | 2-hydroxymethyl-3-aminopentane |
| 32 | 2-hydroxy-3-methyl-4-aminohexane |
| 33 | 3-amino-4-methyl-5-hydroxyheptane |
| 34 | 3-amino-4-hydroxymethylhexane |
| 35 | 2-hydroxy-3-ethyl-4-aminohexane |
| 36 | 3-amino-4-ethyl-5-hydroxyheptane |

TABLE II

| Spray Development Programs | | | | |
|---|---|---|---|---|
| Step | Wafer Rotation | Material Applied | Mode | Duration of Step |
| Spray Develop Program 1 | | | | |
| 1 | 50 rpm | Developer | Spray | 42 sec. |
| 2 | 1,000 rpm | DI water | Stream | 10 sec. |
| 3 | 4,000 rpm | None | Dry | 10 sec. |
| Spray Develop Program 2 | | | | |
| 1 | 1,000 rpm | DI water | Stream | 2 sec. |
| 2 | 1,000 rpm | Developer | Spray | 10 sec. |
| 3 | 400 rpm | Developer | Spray | 5 sec. |
| 4 | 0 rpm | Developer | Spray | 2 sec. |
| 5 | 0 rpm | None | Puddle | 15 sec. |
| 6 | 1,000 rpm | DI water | Stream | 10 sec. |
| 7 | 4,000 rpm | None | Dry | 10 sec. |
| Spray Develop Program 3 | | | | |
| 1 | 450 rpm | Developer | Spray | 7 sec. |
| 2 | 50 rpm | Developer | Spray | 4 sec. |
| 3 | 0 rpm | None | Puddle | 15 sec. |
| 4 | 50 rpm | Developer | Spray | 4 sec. |
| 5 | 0 rpm | None | Puddle | 15 sec. |
| 6 | 50 rpm | Developer | Spray | 4 sec. |
| 7 | 0 rpm | None | Puddle | 15 sec. |
| 8 | 1,000 rpm | DI water | Stream | 10 sec. |
| 9 | 5,000 rpm | None | Dry | 10 sec. |

TABLE III

| | MEA, Examples 1-4 | | | |
|---|---|---|---|---|
| Component | 1 | 2 | 3 | 4 |
| Wt. % TMAH | 1.60 | 1.00 | 1.00 | 0.50 |
| Wt. % MEA | 12.5 | 37.9 | 37.9 | 80.0 |
| Wt. % $H_2O$ | 85.9 | 61.1 | 61.1 | 19.50 |
| Total % | 100.00 | 100.00 | 100.00 | 100.00 |
| Development Mode | I | I | spray | I |
| $mJ/cm^2$ | 70 | 50 | 50 | 100 |
| Result | good | good | poor spray | LR; poor develop |
| Ratio | 1:7.8 | 1:37.9 | 1:37.9 | 1:160 |

TABLE IV

| | 1,2-MPA, Examples 5-8 | | | |
|---|---|---|---|---|
| | 5 | 6 | 7 | 8 |
| Wt. % TMAH | 1.25 | 1.25 | 1.00 | 1.05 |
| Wt. % 1,2-MPA | 15.0 | 15.0 | 18.0 | 21.0 |
| Wt. % X-100 | — | — | — | 0.01 |
| Wt. % $H_2O$ | 83.75 | 83.75 | 81.00 | 77.94 |
| Total % | 100.00 | 100.00 | 100.00 | 100.00 |
| Development Mode | I | spray 2 | I | spray 2 |
| $mj/cm^2$ | 60 | 70 | 50 | 70 |
| Result | res. | poor spray | good | res. and poor spray |
| Ratio | 1:12 | 1:12 | 1:18 | 1:20 |

TABLE V

| | 1,3-MPA, Examples 9-13 | | | | |
|---|---|---|---|---|---|
| | 9 | 10 | 11 | 12 | 13 |
| Wt. % TMAH | 1.20 | 1.20 | 1.20 | 1.20 | 0.96 |
| Wt. % 1,3-MPA | 14.4 | 14.4 | 14.40 | 14.40 | 14.40 |
| Wt. % X-100 | — | — | .01 | .01 | .01 |
| Wt. % $H_2O$ | 84.40 | 84.40 | 84.39 | 84.39 | 84.63 |
| Total % | 100.00 | 100.00 | 100.00 | 100.00 | 100.00 |
| Development Mode | spray 2 | spray 2 | spray 2 | spray 2 | spray 1 |
| $mJ/cm^2$ | 60 | 60 | 80 | 70 | 190 |
| Result | res. | good | res. | good | good |
| Ratio | 1:12 | 1:12 | 1:12 | 1:12 | 1:15 |

TABLE VI

| | 1,3 MPA, Examples 14-19 | | | | | |
|---|---|---|---|---|---|---|
| | 14 | 15 | 16 | 17 | 18 | 19 |
| Wt. % TMAH | 1.00 | 1.10 | 1.10 | 1.60 | 0.95 | 0.70 |
| Wt. % 1,3-MPA | 15.0 | 16.5 | 16.5 | 4.80 | 19.0 | 26.53 |
| Wt. % X-100 | .005 | .01 | .05 | — | — | — |
| Wt. % $H_2O$ | 83.995 | 82.39 | 82.35 | 93.60 | 80.05 | 72.77 |
| Total % | 100.00 | 100.00 | 100.00 | 100.00 | 100.00 | 100.00 |
| Development Mode | spray 1 | spray 1 | spray 1 | I | I | I |
| $mJ/cm^2$ | 110 | 60 | 70 | 120 | 50 | 50 |
| Result | good | good | sidewall slope | good | good | rough |
| Ratio | 1:15 | 1:15 | 1:15 | 1:3 | 1:20 | 1:37.9 |

TABLE VII

| | Comparative Examples 20-24 | | | | |
|---|---|---|---|---|---|
| Component | 20 | 21 | 22 | 23 | 24 |
| Wt. % TMAH | 3.0 | 1.65 | 1.05 | 0.84 | 0.90 |
| Wt. % EDA | 9.0 | 4.95 | 12.6 | 17.4 | 34.02 |
| Wt. % $H_2O$ | 88.0 | 93.40 | 86.35 | 81.76 | 65.08 |
| Total % | 100.00 | 100.00 | 100.00 | 100.00 | 100.00 |
| Development Mode | I | I | I | I | I |
| $mJ/cm^2$ | 10-110 | 50 | 50 | 50 | 60 |
| Result | strip | res. | res. | res. | heavy res.; LR |
| Ratio | 1:3 | 1:3 | 1:12 | 1:20 | 1:37.8 |

TABLE VIII

| | Comparative Examples 25-29 | | | | |
|---|---|---|---|---|---|
| Component | 25 | 26 | 27 | 28 | 29 |
| Wt. % TMAH | 2.40 | 2.55 | 0.87 | 0.90 | 2.2 |
| Wt. % EG | 7.20 | 30.6 | 17.40 | 34.02 | — |
| Wt. % $H_2O$ | 90.40 | 66.95 | 81.73 | 65.08 | 97.8 |
| Total % | 100.00 | 100.00 | 100.00 | 100.00 | 100.00 |
| Development Mode | I | I | spray | spray | I |
| $mJ/cm^2$ | 60 | 80 | 70 | 50 | 50 |
| Result | res. | res. | res. | heavy res. | res. |
| Ratio | 1:3 | 1:12 | 1:20 | 1:37.8 | — |

(Mode entries: columns 27 and 28 show "2"; Mode row values across 25-29: —, —, 2, 2, —)

TABLE IX

| | Comparative Examples 30-35 | | | | | |
|---|---|---|---|---|---|---|
| Component | 30 | 31 | 32 | 33 | 34 | 35 |
| Wt. % TMAH | 1.00 | 1.00 | 1.00 | 1.00 | 1.00 | 1.00 |
| Wt. % DEA | 10.00 | 20.00 | — | — | — | — |
| Wt. % TEA | — | — | 10.00 | 20.00 | — | — |
| Wt. % DEEA | — | — | — | — | 10.00 | 20.00 |
| Wt. % $H_2O$ | 89.00 | 79.00 | 89.00 | 79.00 | 89.00 | 79.00 |
| Total % | 100.00 | 100.00 | 100.00 | 100.00 | 100.00 | 100.00 |
| Development Mode | I | I | I | I | I | I |
| $mJ/cm^2$ | 400 | 400 | 400 | 400 | — | — |
| Result | latent image only | latent image only | latent image only | latent image only | strip | strip |
| Ratio | 1:10 | 1:20 | 1:10 | 1:20 | 1:10 | 1:20 |

TABLE X

| | Examples 36-41 | | | | | |
|---|---|---|---|---|---|---|
| Component | 36 | 37 | 38 | 39 | 40 | 41 |
| TMAH | 1.25 | 1.20 | 1.00 | 0.70 | 0.84 | 2.0 |
| 1,2-MPA | 15 | — | — | — | — | — |
| 1,3-MPA | 0 | 14.40 | 15.0 | 26.53 | — | — |
| EDA | 0 | — | — | — | 16.8 | — |
| X-100 | 0 | .01 | .01 | — | — | — |
| $H_2O$ | 83.75 | 84.39 | 83.99 | 72.77 | 82.36 | 98.00 |
| Total % | 100.00 | 100.00 | 100.00 | 100.00 | 100.00 | 100.00 |
| Development Mode | spray 2 | spray 1 | spray 2 | spray 3 | I | spray 2 |
| $mJ/cm^2$ | 70 | 60 | 110 | 50 | 50 | 90 |
| Result | res. poor spray | slight res. | good | rough | heavy res. | heavy res. |
| Ratio | 1:12 | 1:12 | 1:15 | 1:37.9 | 1:20 | — |

TABLE XI

| | Examples 42-43 | |
|---|---|---|
| Component | 42 | 43 |
| TMAH | 0.96 | 0.96 |
| Morpholine | 14.4 | — |
| DMAP | — | 14.4 |
| $H_2O$ | 84.64 | 84.64 |
| Total % | 100.00 | 100.00 |
| Development Mode | I | I |
| $mJ/cm^2$ | — | — |
| Result | rough; no res. | good; no res. |
| Ratio | 15:1 | 15:1 |

We claim:

1. A composition for developing an image-wise exposed quinone diazide positive-working photoresist, consisting essentially of an aqueous solution of:
   A. at least one tetraalkylammonium hydroxide, present in an amount effective to enable said composition to develop said photoresist; and
   B. at least one adjunct having a structure selected from the group consisting of Structure I:

and

Structure II:

wherein n is 0 or 1; m is 1 or 2; each $R^1$ and $R^2$ is independently selected from hydrogen, methyl, or ethyl, but in Structure I the two $R^2$'s are not both ethyl; and wherein the weight ratio of said tetraalkylammonium hydroxide to said adjunct is less than or equal to 1:3 and being present in an amount sufficient to reduce formation of irregular deposits on the edges of unexposed portions of said photoresist while it is developed.

2. The composition of claim 1, wherein said tetraalkylammonium hydroxide is tetramethylammonium hydroxide.

3. The composition of claim 1, wherein said composition contains from about 0.7 to about 2.0 weight percent of said tetraalkylammonium hydroxide.

4. The composition of claim 1, wherein said composition contains from about 0.8 to about 1.6 weight percent of said tetraalkylammonium hydroxide.

5. The composition of claim 1, wherein said composition contains from about 0.9 to about 1.1 weight percent of said tetraalkylammonium hydroxide.

6. The composition of claim 1, wherein said adjunct comprises morpholine.

7. The composition of claim 1, wherein said adjunct comprises dimethyl-3-amino-1-propanol.

8. The composition of claim 1, wherein the weight ratio of said tetraalkylammonium hydroxide to said adjunct is less than or equal to 1:9.

9. The composition of claim 1, wherein the weight ratio of said tetraalkylammonium hydroxide to said adjunct is from about 1:12 to about 1:38.

10. The composition of claim 1, wherein the weight ratio of said tetraalkylammonium hydroxide to said adjunct is about 1:15.

11. The composition of claim 1, further consisting essentially of from 0 to about 0.05 percent by weight of a nonionic surfactant.

12. A composition for developing an image-wise exposed quinone diazide positive-working photoresist, consisting essentially of an aqueous solution of:
A. at least one tetraalkylammonium hydroxide, present in an amount effective to enable said composition to develop said photoresist; and
B. at least one adjunct having a structure selected from the group consisting of

Structure I:

and

Structure II:

wherein n is 0 or 1; m is 1 or 2; each $R^1$ and $R^2$ is independently selected from hydrogen, methyl, or ethyl, but in Structure I the two $R^2$'s are not both ethyl; and wherein the weight ratio of said tetraalkylammonium hydroxide to said adjunct is less than or equal to 1:3 and being present in an amount sufficient in an mount sufficient to increase the $C_p$ value of said composition.

13. A composition for developing an image-wise exposed quinone diazide positive-working photoresist, consisting essentially of an aqueous solution of:
A. at least one tetraalkylammonium hydroxide, present in an amount effective to enable said composition to develop said photoresist; and
B. at least one adjunct having a structure selected from the group consisting of

Structure I:

and

Structure II:

wherein n is 0 or 1; m is 1 or 2; each $R^1$ and $R^2$ is independently selected from hydrogen, methyl, or ethyl, but in Structure I the two $R^2$'s are not both ethyl; and wherein the weight ratio of said tetraalkylammonium hydroxide to said adjunct is less than or equal to 1:3 and being present in an amount sufficient to increase the process latitude of said composition.

14. A composition for developing an image-wise exposed quinone diazide positive-working photoresist, consisting essentially of an aqueous solution of:
A. a tetraalkylammonium hydroxide, present in an amount effective to enable said composition to develop said photoresist; and
B. an alkanolamine having the following structure:

wherein n is zero or one; each R is independently selected from hydrogen, methyl, or ethyl; and wherein the weight ratio of said tetraalkylammonium hydroxide to said alkanolamine is less than or equal to 1:3 and being present in an amount sufficient to reduce formation of irregular deposits on the edges of unexposed portions of said photoresist while it is developed.

15. The composition of claim 14, wherein said tetraalkylammonium hydroxide is tetramethylammonium hydroxide.

16. The composition of claim 14, wherein said composition contains from about 0.7 to about 2.0 weight percent of said tetraalkylammonium hydroxide.

17. The composition of claim 14, wherein said composition contains from about 0.8 to about 1.6 weight percent of said tetraalkylammonium hydroxide.

18. The composition of claim 14, wherein said composition contains from about 0.9 to about 1.1 weight percent of said tetraalkylammonium hydroxide.

19. The composition of claim 14, wherein said alkanolamine is 1-amino-3-hydroxypropane.

20. The composition of claim 14, wherein said alkanolamine is 1-amino-2-hydroxypropane.

21. The composition of claim 14, wherein said alkanolamine is 1-amino-2-hydroxyethane.

22. The composition of claim 14, wherein the weight ratio of said tetraalkylammonium hydroxide to said alkanolamine is less than or equal to 1:9.

23. The composition of claim 14, wherein the weight ratio of said tetraalkylammonium hydroxide to said alkanolamine is from about 1:12 to about 1:38.

24. The composition of claim 14, wherein the weight ratio of said tetraalkylammonium hydroxide to said alkanolamine is about 1:15.

25. The composition of claim 14, further consisting essentially of from 0 to about 0.05 percent by weight of a nonionic surfactant.

26. The composition of claim 14, wherein said composition contains:
A. from about 0.8 to about 1.6 weight percent tetramethylammonium hydroxide as said tetraalkylammonium hydroxide;
B. 1-amino-3-hydroxypropane as said alkanolamine, wherein the weight ratio of tetramethylammonium hydroxide to 1-amino-3hydroxypropane is from about 1:12 to about 1:38; and

C. from 0 to about 0.05 weight percent of a nonionic surfactant.

27. A composition for developing an image-wise exposed quinone diazide positive-working photoresist, consisting essentially of an aqueous solution of:
A. a tetraalkylammonium hydroxide, present in an amount sufficient to enable said composition to develop said photoresist; and
B. an alkanolamine having the following structure:

wherein n is zero or one; each R is independently selected from hydrogen, methyl, or ethyl; and wherein the weight ratio of said tetraalkylammonium hydroxide to said alkanolamine is less than or equal to 1:3 and being present in an amount sufficient to increase the $C_p$ value of said composition.

28. A composition for developing an image-wise exposed quinone diazide positive-working photoresist, consisting essentially of an aqueous solution of:
A. a primary tetraalkylammonium hydroxide, present in an amount sufficient to enable said composition to develop said photoresist; and
B. an alkanolamine having the following structure:

wherein n is zero or one; each R is independently selected from hydrogen, methyl, or ethyl; and wherein the weight ratio of said tetraalkylammonium hydroxide to said alkanolamine is less than or equal to 1:3 and being present in an amount sufficient to increase the process latitude of said composition.

* * * * *